(12) United States Patent
Lee et al.

(10) Patent No.: US 12,237,311 B2
(45) Date of Patent: Feb. 25, 2025

(54) LIGHTING MODULE, LIGHTING DEVICE AND LAMP

(71) Applicant: LG INNOTEK CO., LTD., Seoul (KR)

(72) Inventors: Jung Ho Lee, Seoul (KR); Hyun Hee Chae, Seoul (KR); Ki Chang Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 546 days.

(21) Appl. No.: 17/622,943

(22) PCT Filed: Jul. 2, 2020

(86) PCT No.: PCT/KR2020/008673
§ 371 (c)(1),
(2) Date: Dec. 27, 2021

(87) PCT Pub. No.: WO2021/002704
PCT Pub. Date: Jan. 7, 2021

(65) Prior Publication Data
US 2022/0262774 A1    Aug. 18, 2022

(30) Foreign Application Priority Data
Jul. 4, 2019   (KR) .................. 10-2019-0080534

(51) Int. Cl.
*H01L 25/075* (2006.01)
*F21S 41/151* (2018.01)
(Continued)

(52) U.S. Cl.
CPC .......... *H01L 25/0753* (2013.01); *H01L 33/54* (2013.01); *H01L 33/60* (2013.01); *F21S 41/151* (2018.01)

(58) Field of Classification Search
CPC ..... H01L 25/0753; H01L 33/52; H01L 33/54; H01L 33/58; F21S 41/151; F21S 41/153; F21S 41/255; F21S 43/14; F21S 43/28131
(Continued)

(56) References Cited

U.S. PATENT DOCUMENTS

| 8,267,565 B2 | 9/2012 | Pan |
| 9,231,166 B2 | 1/2016 | Lee et al. |

(Continued)

FOREIGN PATENT DOCUMENTS

| CN | 103117348 | 5/2013 |
| JP | 2004-319445 | 11/2004 |

(Continued)

OTHER PUBLICATIONS

Chinese Office Action dated May 19, 2023 issued in Application No. 202080049332.2.
(Continued)

*Primary Examiner* — Fazli Erdem
(74) *Attorney, Agent, or Firm* — KED & Associates LLP

(57) ABSTRACT

A lighting device disclosed in an embodiment of the invention includes: a first substrate; a first light emitting device disposed on the first substrate; a resin layer disposed on the first substrate; a second substrate disposed on the resin layer; and a second light emitting device disposed on the second substrate and disposed in the resin layer. The resin layer may include a first surface from which light emitted from the first and second light emitting devices is emitted, and the first surface of the resin layer may include a plurality of convex portions and a plurality of concave portions.

20 Claims, 9 Drawing Sheets

(51) Int. Cl.
*H01L 33/54* (2010.01)
*H01L 33/60* (2010.01)

(58) Field of Classification Search
USPC .......................................................... 257/91
See application file for complete search history.

(56) References Cited

U.S. PATENT DOCUMENTS

| | | | |
|---|---|---|---|
| 10,128,423 | B2 | 11/2018 | Lee et al. |
| 10,227,037 | B2 | 3/2019 | Na et al. |
| 10,345,509 | B2 | 7/2019 | Den Breejen et al. |
| 10,809,447 | B2 | 10/2020 | Den Breejen et al. |
| 11,164,993 | B2 | 11/2021 | Kang et al. |
| 2010/0284182 | A1 | 11/2010 | Pan |
| 2013/0121000 | A1 | 5/2013 | Lee et al. |
| 2013/0135896 | A1 | 5/2013 | Kuo |
| 2016/0079507 | A1* | 3/2016 | Lee ................. H01L 33/58 257/98 |
| 2017/0368989 | A1 | 12/2017 | Kang |
| 2018/0074255 | A1 | 3/2018 | Den Breejen et al. |
| 2019/0324188 | A1 | 10/2019 | Den Breejen et al. |
| 2020/0386936 | A1 | 12/2020 | Den Breejen et al. |
| 2022/0252229 | A1* | 8/2022 | Choi ..................... F21S 43/195 |
| 2024/0194824 | A1* | 6/2024 | Kang ..................... H01L 33/56 |

FOREIGN PATENT DOCUMENTS

| | | |
|---|---|---|
| JP | 2009-008856 | 1/2009 |
| JP | 31610024 | 7/2010 |
| JP | 2011-146172 | 7/2011 |
| JP | 5450116 | 3/2014 |
| KR | 10-2013-0050185 | 5/2013 |
| KR | 10-2014-0061797 | 5/2014 |
| KR | 10-2015-0140451 | 12/2015 |
| KR | 10-2017-0079297 | 7/2017 |
| KR | 10-2018-0001925 | 1/2018 |
| KR | 10-2019-0052690 | 5/2019 |
| KR | 10-2019-0054605 | 5/2019 |
| WO | WO 2018/049395 | 3/2018 |

OTHER PUBLICATIONS

Japanese Office Action dated May 14, 2024 issued in Application No. 2021-578020.
Korean Office Action dated Jun. 21, 2024 issued in Application No. 10-2019-0080534.

* cited by examiner

LIGHTING MODULE, LIGHTING DEVICE AND LAMP

CROSS-REFERENCE TO RELATED PATENT APPLICATIONS

This application is a U.S. National Stage Application under 35 U.S.C. § 371 of PCT Application No. PCT/KR2020/008673, filed Jul. 2, 2020, which claims priority to Korean Patent Application No. 10-2019-0080534, filed Jul. 4, 2019, whose entire disclosures are hereby incorporated by reference.

TECHNICAL FIELD

An embodiment of the invention relates to a lighting module having a plurality of light emitting devices. An embodiment of the invention relates to a lighting module that provides a surface light source in the form of a line. Embodiments relate to a lighting device having a lighting module, a light unit, a liquid crystal display, and a vehicle lamp.

BACKGROUND ART

Lighting applications include vehicle lights as well as backlights for displays and signage. Light emitting diodes (LEDs) have advantages such as low power consumption, semi-permanent lifespan, fast response speed, safety, and environmental friendliness compared to conventional light sources such as fluorescent lamps and incandescent lamps. Such a light emitting device is applied to various lighting devices such as various display devices, indoor lights or outdoor lights. Recently, as a light source for a vehicle, a lamp employing an LED has been proposed. Compared with incandescent lamps, LEDs are advantageous in that their power consumption is small. However, since an emission angle of the light emitted from the LED is small, when the LED is used as a vehicle lamp, there is a demand for increasing the light emitting area of the lamp using the LED. Because LED is small in size, it can increase the design freedom of the lamp, and it is also economical due to its semi-permanent lifespan.

DISCLOSURE

Technical Problem

An embodiment of the invention provides a lighting module or a lighting device that illuminates with a line-type light source or a surface light source. An embodiment of the invention provides a lighting module or lighting device having a light emitting device protruding from both sides of a resin layer in the direction of the resin layer. An embodiment of the invention provides a lighting module or lighting device in which a light emitting device protruding from a first substrate disposed under a resin layer in the direction of the resin layer and a second light emitting device protruding from a second substrate disposed on the resin layer in the direction of the resin layer are arranged in one or two rows. An embodiment of the invention provides a lighting module or lighting device in which a reflective member is disposed on an upper surface and/or a lower surface of a resin layer on which a plurality of first and second light emitting devices are disposed. An embodiment of the invention may provide a lighting module for irradiating a line-shaped side light source or a surface light source, and a lighting device, a light unit, a liquid crystal display device, or a vehicle lamp having the same.

Technical Solution

A lighting device according to an embodiment of the invention includes: a first substrate; a plurality of first light emitting devices disposed on the first substrate; a resin layer disposed on the first substrate and including a plurality of holes; a second substrate disposed on the resin layer; and a plurality of second light emitting devices disposed on the second substrate and respectively disposed in the plurality of holes, wherein the resin layer includes a first surface from which light emitted from the first and second light emitting devices is emitted. and the first surface of the resin layer may include a plurality of convex portions and a plurality of concave portions.

According to an embodiment of the invention, each of the plurality of first light emitting devices may face each of the plurality of convex portions, and each of the plurality of second light emitting devices may face each of the plurality of concave portions. The plurality of holes in the resin layer may be formed to penetrate from the lower surface of the second substrate in the direction of the first substrate. Each of the plurality of holes may be disposed in a region between the plurality of first light emitting devices. The hole may include a concave portion or a concave reflective portion having a convex curved surface corresponding to the concave portion. An embodiment of the invention may include a first reflective member on the resin layer and the first substrate, and the side surface of the resin layer and the side surfaces of the first substrate and the second substrate may be disposed on the same plane. A second reflective member may be included between the resin layer and the second substrate. An embodiment of the invention may include a third reflective member disposed on a surface opposite to the first surface of the resin layer.

A lighting device according to an embodiment of the invention includes: a first substrate; a plurality of first light emitting devices disposed on the first substrate; a first reflective member disposed on the first substrate; a resin layer disposed on the first reflective member; a second substrate disposed on the resin layer; and a plurality of second light emitting devices disposed under the second substrate, wherein the resin layer includes a plurality of holes in which the second light emitting devices are respectively disposed, and a first surface of the resin layer faces the emission surfaces of the first and second light emitting devices and includes a plurality of convex portions and a plurality of concave portions, wherein the convex portions face each of the plurality of first light emitting devices, and the concave portions may face each of the plurality of holes or each of the plurality of second light emitting devices.

Advantageous Effects

According to an embodiment of the invention, the luminous intensity of the light source may be improved, and a line-shaped surface light source may be provided by a plurality of point light sources. In addition, the light efficiency of the lighting module may be improved, and the light collection efficiency may be improved by the planar light source having a line width in one direction.

According to an embodiment of the invention, since a lighting module with thin thickness is provided in the form of a line light source, the degree of freedom in design may be increased and the light uniformity of the surface light source of the line form may be improved. It is possible to improve the optical reliability of the lighting module and the lighting device having the same according to an embodiment of the invention. The invention may be applied to a light unit having a lighting module, various types of display devices, a surface light source lighting device, or a vehicle lamp.

BEST MODE

Figure 1:
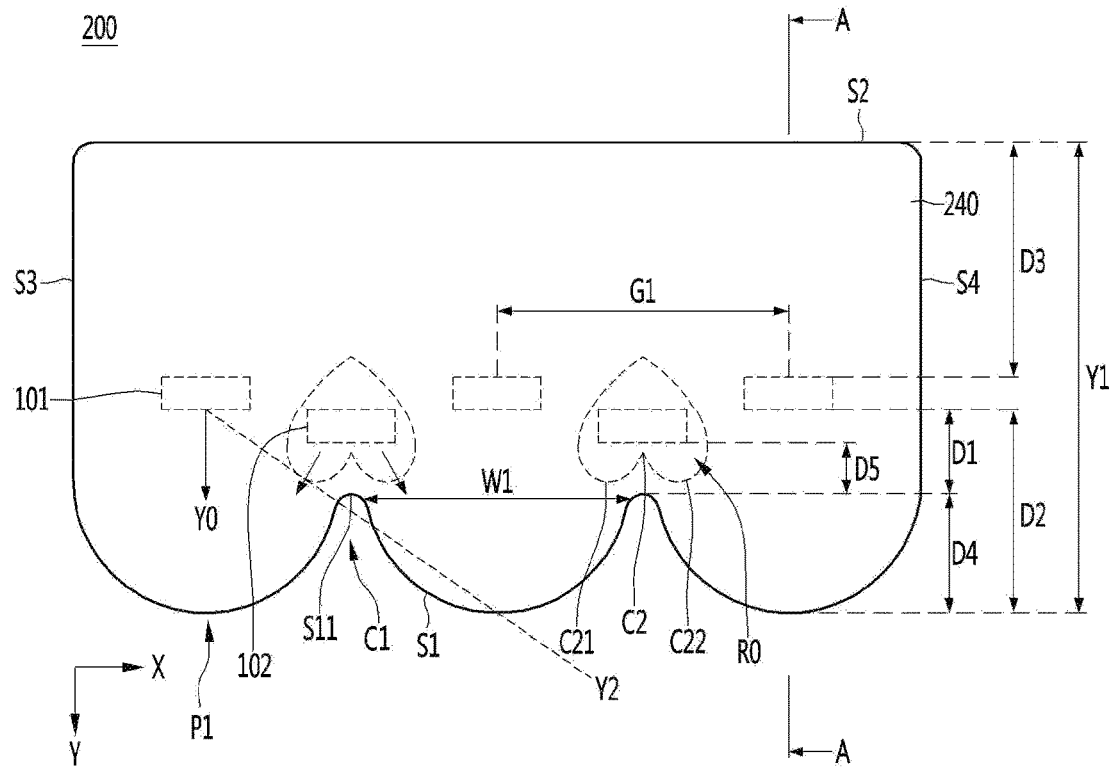
FIG. 1 is a plan view of a lighting module according to an embodiment of the invention.

Hereinafter, preferred embodiments of the present invention will be described in detail with reference to the accompanying drawings. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings. The lighting device according to the invention may be applied to various lamp devices that require lighting, such as vehicle lamps, household lighting devices, and industrial lighting devices. For example, when applied to vehicle lamps, it is applicable to head lamps, car width lights, side mirror lights, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development. Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Module>

Figure 2:
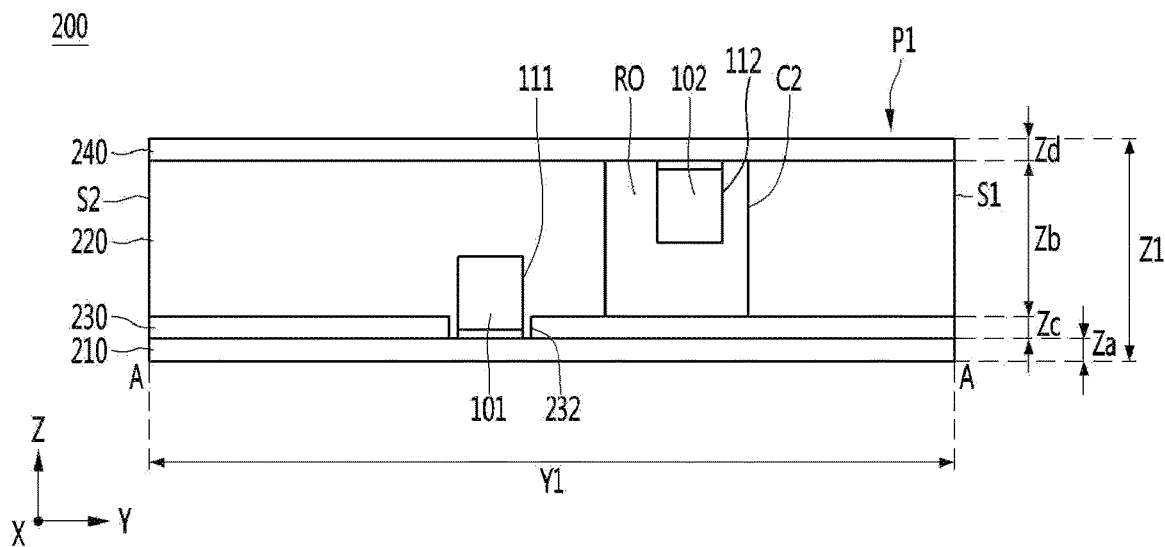
FIG. 2 is a cross-sectional view taken along the A-A side of the lighting module of FIG. 1.

FIG. 1 is a plan view of a lighting module according to an embodiment of the invention, and FIG. 2 is a cross-sectional view taken along the A-A side of the lighting module of FIG. 1. Referring to FIGS. 1 and 2, the lighting module 200 according to an embodiment of the invention includes a plurality of light emitting devices 101 and 102 therein, and may be a device that irradiates a point light emitted from the light emitting devices 101 and 102 through a line-shaped exit surface of lighting module 200. The plurality of light emitting devices 101 and 102 may include a plurality of first light emitting devices 101 arranged in a first direction X and a plurality of second light emitting devices 102 arranged in the first direction X. The plurality of first light emitting devices 101 may be connected to each other in series, parallel, or series-parallel. The plurality of second light emitting devices 102 may be connected to each other in series, parallel, or series-parallel. The first light emitting device 101 and the second light emitting device 102 may be electrically separated. The first light emitting device 101 and the second light emitting device 102 may emit light in a second direction or in a direction of a first surface S1. The first emission surface 111 of the first light emitting device 101 and the second emission surface 112 of the second light emitting device 102 may be exposed in the same direction. The center of the first emission surface 111 of the first light emitting device 101 and the center of the second emission surface 112 of the second light emitting device 102 may be disposed at different heights. One of the first and second light emitting devices 101 and 102 may be disposed below the lighting module, and the other may be disposed above the lighting module. One of the first and second light emitting devices 101 and 102 may be disposed under the resin layer 220, and the other may be disposed on the resin layer 220. The lighting module 200 may include a first surface S1 facing the first and second light emitting devices 101 and 102, a second surface S2 opposite to the first surface S1, and third and fourth surfaces S3 and S4 extending in the second direction from both ends of the first surface S1 and the second surface S2. The first surface S1 and the second surface S2 may include at least one of a linear shape, an oblique shape, or a curved shape. The first surface S1 and the second surface S2 may have a long length in the first direction X or in one direction. The first surface S1 faces the first and second emission surfaces 111 and 112 of the first and second light emitting devices 101 and 102 or may be surface exposed in the second direction from the first ends of the third surface S3 and the fourth surface S4, and the second surface S2 faces the surfaces opposite to the emission side of the plurality of first and second light emitting devices 101 and 102 or may be surface exposed in the second direction from the second ends the third surface S3 and the fourth surface S4. The third and fourth surfaces S3 and S4 may be different from the first and second surfaces S1 and S2. The first surface S1, the second surface S2, the third surface S3, and the fourth surface S4 may be provided as surfaces parallel to the third direction. The second surface S2 may be disposed in a direction perpendicular to the third surface S3 and the fourth surface S4. The third direction Z may be a direction orthogonal to the first and second directions X and Y. The first surface S1, the second surface S2, the third surface S3, and the fourth surface S4 may have the same thickness or the same height in the third direction Z.

The plurality of first light emitting devices 101 may be arranged in at least one row, and as another example, may be arranged in two rows. The plurality of second light emitting devices 102 may be arranged in one row. The plurality of first light emitting devices 101 and the second light emitting device 102 may not overlap in the second direction or in the direction from the first surface S1 to the second surface S2. The first light emitting device 101 and the second light emitting device 102 may be disposed on the same line or may be disposed on different lines. Each of the second light emitting devices 102 may be disposed in a middle region between the first light emitting devices 101 or disposed at a position adjacent to the first surface S1 or the second surface S2 in the middle region. The first and second light emitting devices 101 and 102 may be alternately disposed along the first direction. The number of the first light emitting devices 101 may be greater than that of the second light emitting devices 102.

The first and second light emitting devices 101 and 102 alternately arranged in the first direction X may face the first surface S1 and irradiate light through the first surface S1. Some light emitted from the first and second light emitting devices 101 and 102 may be emitted through at least one of the second surface S2, the third surface S3, and the fourth surface S4. The lighting module 200 may have a length in the first direction X longer than a width Y1 in the second direction Y. The length of the first direction X may vary depending on the number of arrangements of the first light emitting devices 101, and may be, for example, 30 mm or more. The width Y1 in the second direction may be 13 mm or more or 16 mm or more. The width Y1 in the second direction Y of the lighting module 200 may be provided a region for diffusing the emitted light of the first and second light emitting devices 101 and 102 and a region protecting the rear of the first and second light emitting devices 101 and 102.

As shown in FIG. 1, a distance D2 between the first light emitting device 101 and the first surface S1 and a distance D3 between the first light emitting device 101 and the second surface (S2) with respect to the first light emitting device 101 may be different from each other. The distance D3 between the first light emitting device 101 and the second surface S2 may be 2 mm or more, for example, may be in the range of 2 mm to 20 mm. When the distance D3 between the first light emitting device 101 and the second surface S2 is smaller than the above range, the region where moisture may penetrate or form a circuit pattern may be reduced. The size of the module 200 may be increased. Here, the relationship of the distance D2<D3 may be satisfied. The lighting module 200 may include a plurality of convex portions P1 corresponding to each of the first light emitting devices 101 and a concave portion C1 between the plurality of convex portions P1. The distance from the convex portion P1 to the first light emitting device 101 may increase as the region corresponding to the center of the first light emitting device 101 increases. The convex portion P1 may protrude in the direction of the first surface S1 with respect to the first light emitting device 101, and the concave portion C1 may be concavely formed in the direction of the second surface S2 with respect to the first surface S1. The convex portion P1 may include a convex curved surface. The concave portion C1 may include a concave curved surface. The convex portion P1 may have a first curvature, and the concave portion C1 may have a second curvature having a smaller radius than the first curvature. The concave portion C1 may be depressed in the direction of the second surface S2 between the convex portions P1, and may face the second light emitting device 102. The second light emitting device 102 may face the concave portion C1, respectively. The minimum distance D5 between the second light emitting device 102 and the concave portion C1 may be smaller than the maximum distance D2 between the first light emitting device 101 and the convex portion P1. The second light emitting device 102 may reduce a dark portion on the concave portion C1 and may reduce a difference in uniformity with light emitted through the convex portion P1. The lighting module 200 includes a first substrate 210, a first light emitting device 101 on the first substrate 210, a resin layer 220 on the first substrate 210, a second substrate 240 on the resin layer 220, and a second light emitting device 102 protruding from the second substrate 240 to the resin layer 220. The lighting module 200 may include a first reflective member 230 between the resin layer 220 and the first substrate 210. The resin layer 220 may be a light-transmitting layer. The resin layer 220 may include a glass material as another material.

The resin layer 220 includes an outer side surface, and the outer side surface includes the first surface S1, the second surface S2, the third surface S3, and the fourth surface S4. The resin layer 220 may be disposed to surround the devices disposed on the first substrate 210, for example, the plurality of first and second light emitting devices 101 and 102. For example, three or more of the plurality of first light emitting devices 101 may be arranged in the direction of the fourth surface S4 in a region adjacent to the third surface S3. For convenience of description, three first light emitting devices 101 will be described as an example, and as will be described later, the number may be 10 or more, but is not limited thereto. The convex portion P1 and the concave portion C1 may be respectively formed on the first substrate 210, the resin layer 220, the first reflective member 230, and the second substrate 240. The resin layer 220 may include the convex portion P1 and the concave portion C1. The convex portion P1 and the concave portion C1 may be disposed along the first surface S1 and may be disposed between the first substrate 210 and the second substrate 240. The convex portion P1 may be overlapped with the first light emitting device 101 in the second direction Y, respectively, or may overlapped with the first emission surface 111 of the first light emitting device 101 in the second direction Y of the first light emitting device 101. The convex portion P1 may diffuse the light emitted from the first emission surface 111 of the first light emitting device 101. The concave portion C1 may overlap a region between the first light emitting devices 101 in the second direction Y, and may transmit or reflect some incident light. The concave portion C1 may be overlapped with the second light emitting device 102 in the second direction Y, respectively, or may be overlapped with the second emission surface 112 of the second light emitting device 102 in the second direction Y. The concave portion C1 may suppress the occurrence of dark portions in the region between the convex portions P1. The resin layer 220 may include a hole R0 in which the second light emitting device 102 is disposed. A plurality of the holes R0 may be disposed such that the second light emitting devices 102 are respectively disposed. The hole R0 may be provided in the form of penetrating the resin layer 220 from the lower surface of the second substrate 240 toward the first substrate 210. The upper surface area of the hole R0 may be the same as the lower surface area, or the upper surface area may be larger than the lower surface area. The upper surface area of the hole R0 may be larger than the lower surface area of the second light emitting device 102. The surface of the hole R0 may be spaced apart from the side surface of the second light emitting device 102 by at least 1 mm, and this separation distance is a value in consideration of a process error caused by the insertion of the second light emitting device 102. The hole R0 may diffuse the light emitted from the second light emitting device 102. A material filling the hole R0 may be different from the refractive index of the resin layer 220. The material filling the hole R0 may have a refractive index lower than that of the material of the resin layer 220. A gas may be disposed in the hole R0, and may include, for example, air or at least one of oxygen, nitrogen, hydrogen, argon, and carbon dioxide gas. The hole R0 may be in a vacuum state. As another example, the hole R0 may be filled with a material having a refractive index higher than that of the resin layer 220. The material having a high refractive index may include a metal oxide or a metal nitride. The lower surface of the second substrate 240 may be exposed on the upper surface of the hole R0, and the upper surface of the first substrate 210 and/or the upper surface of the first reflective member 230 may be exposed on the lower surface of the hole R0. In the structure shown in FIG. 3, the lower surface of the second reflective member 245 may be exposed on the upper surface of the hole R0. Each of the holes R0 may correspond to the concave portion C1, respectively. Holes R0 into which the second light emitting device 102 is inserted may be respectively disposed between the concave portion C1 and the second surface S2. The height of the hole R0 may be equal to or greater than the thickness Zb of the resin layer 220. The holes R0 may be respectively disposed between the first light emitting devices 101.

The first and second substrates 210 and 240 include a printed circuit board (PCB), for example, a resin-based printed circuit board (PCB), a metal core PCB, and a flexible PCB, ceramic PCB, or FR-4 substrate. The first substrate 210 may be a flexible or non-ductile substrate. A circuit pattern may be disposed on the first substrate 210. A circuit pattern may be disposed on a lower portion of the second substrate 240. The circuit patterns of the first and second substrates 210 and 240 may include a plurality of pads in regions corresponding to the first and second light emitting devices 101 and 102. Among the regions of the first substrate 210, a rear region with respect to the first light emitting device 101 may be a region opposite to the region from which light is emitted, and circuit patterns for connecting the first light emitting device 101 are disposed. The width of the rear region may vary according to the number of the first light emitting devices 101 or a connection method of the first light emitting devices 101. The width of the rear region is the distance D3 between the first light emitting device 101 and the second surface S2, and may be 2 mm or more. Accordingly, a circuit pattern for connecting the plurality of first light emitting devices 101 may be formed while suppressing moisture penetration from the rear of the first light emitting device 101.

Among the regions of the second substrate 240, a rear region with respect to the second light emitting device 102 is a region opposite to the region from which light is emitted, and circuit patterns for connecting the second light emitting device 102 may be disposed in the rear region. The plurality of first light emitting devices 101 may have a bonding portion disposed thereunder and may be electrically connected to the pad of the first substrate 210. The plurality of first light emitting devices 101 may be connected in series by a circuit pattern of the first substrate 210. As another example, the plurality of first light emitting devices 101 may be connected in parallel by the circuit pattern of the first substrate 210, or two or more groups connected in series may be connected in parallel.

A bonding portion is disposed on the plurality of second light emitting devices 102, and may be electrically connected to the pad of the second substrate 240. The plurality of second light emitting devices 102 may be connected in series by a circuit pattern of the second substrate 240. As another example, the plurality of second light emitting devices 102 may be connected in parallel by a circuit pattern of the second substrate 240, or a group of two or more connected in series may be connected in parallel. The first emission surface 111 of the first light emitting device 101 may be disposed on a surface adjacent to the first substrate 210, for example, on a side adjacent to the upper surface of the first substrate 210. The first emission surface 111 is disposed on a side surface between the bottom and the upper surface of the first light emitting device 101, and emits light in the second direction Y. The first emission surface 111 of the first light emitting device 101 is adjacent to the first reflective member 230 with respect to the upper surface of the first substrate 210 and may be a vertical plane with respect to the upper surface of the first reflective member 230. The second emission surface 112 of the second light emitting device 102 may be disposed on a surface adjacent to the second substrate 240, for example, on a side adjacent to a lower surface of the second substrate 240. The second emission surface 112 is disposed on a side surface between the lower surface and the upper surface of the second light emitting device 102 and emits light in the second direction Y. The second emission surface 112 of the second light emitting device 102 may be a surface perpendicular to the upper surface of the second substrate 240. The first and second light emitting devices 101 and 102 may include a device including a light emitting chip or a package in which an LED chip is packaged. The light emitting chip may emit at least one of blue, red, green, and ultraviolet (UV) light. The first and second light emitting devices 101 and 102 may emit at least one of white, blue, red, and green. The first and second light emitting devices 101 and 102 may emit light of the same color or different colors. The first and second light emitting devices 101 and 102 may emit light of the same peak wavelength or different peak wavelengths. The first light emitting device 101 emits light in a lateral direction and may be disposed on the first and second substrates 210 and 240. The first and second light emitting devices 101 and 102 may be of a side view type. As another example, the first and second light emitting devices 101 and 102 may be LED chips, and one surface of the LED chip may be opened and a reflective member may be disposed on the other surface. The thicknesses of the first and second light emitting devices 101 and 102 may be smaller than lengths of the first and second light emitting devices 101 and 102 in the first direction X. The thickness of the first and second light emitting devices 101 and 102 may be 3 mm or less, for example, 2 mm or less. The thickness of the first and second light emitting devices 101 and 102 may be in the range of 1 mm to 2 mm, for example, in the range of 1.2 mm to 1.8 mm.

The length of the first and second light emitting devices 101 and 102 in the first direction X may be greater than the thickness of the first and second light emitting devices 101 and 102, for example, may be 1.5 times or more of the thickness of the first and second light emitting devices 101 and 102. Since the first and second light emitting devices 101 and 102 have a thin thickness and a long length in the first direction X, a light emission angle in the first direction X that is the left-right direction with respect to the center of each of the light emitting devices 101 and 102 may provide a wide. Here, the light emission angle of each of the light emitting devices 101 and 102 in the first direction X may be greater than the light emission angle in the third direction Z, which is an up-down direction. Light emission angles in the first direction of the first and second light emitting devices 101 and 102 may range from 110 degrees to 160 degrees. Here, as shown in FIG. 2, the thickness Za of the first substrate 210 may be smaller than the thickness of the first light emitting device 101. The thickness of the first light emitting device 101 may be more than twice the thickness Za of the first substrate 210, for example, it may be in the range of 2 times to 4 times. Since the thickness Za of the first substrate 210 is provided to be thin, the lighting module 200 may be provided as a flexible plate.

The resin layer 220 may be disposed on the first substrate 210. The first reflective member 230 may be disposed between the resin layer 220 and the first substrate 210. The resin layer 220 may cover the first light emitting device 101. The resin layer 220 may be in contact with the upper surface and side surfaces of the first light emitting device 101. The resin layer 220 may be in contact with the upper surface of the first reflective member 230. A portion of the resin layer 220 may be in contact with the first substrate 210 through the first reflective member 230. The resin layer 220 may be in contact with the emission surface of the first light emitting device 101. The first surface S1, the second surface S2, the third surface S3, and the fourth surface S4 of the resin layer 220 are side surfaces between the first and second substrates 210 and 240. The first surface S1, the second surface S2, the third surface S3 and the fourth surface S4 are peripheral surfaces of the first light emitting device 101, or may be a side corresponding to the side surface of the first light emitting device 101. The upper surface area of the resin layer 220 may be the same as the upper surface area of the first substrate 210, the upper surface area of the first reflective member 230, or the upper surface area of the second substrate 240. The length X1 of the resin layer 220 in the first direction X may be the same as the length of the first substrate 210, the length of the first reflective member 230, or the length of the second substrate 240. The maximum length Y1 of the resin layer 220 in the second direction in the second direction Y may be the same as the maximum length of the first substrate 210, the maximum length of the first reflective member 230, or the maximum length of the second substrate 240. The minimum length of the resin layer 220 in the second direction Y may be the same as the minimum length of the first substrate 210, the minimum length of the first reflective member 230, or the minimum length of the second substrate 240. The maximum length in the second direction Y may be a length between the apex of the convex portion P1 of the lighting module and the second surface S2, and the minimum length may be a length between the lower point of the concave portion C1 of the lighting module and the second surfaces S2. The resin layer 220 may be disposed between the first reflective member 230 and the second substrate 240. The first reflective member 230 and the second substrate 240 may have the same area and may be disposed to face each other on a lower surface and an upper surface of the resin layer 220. Accordingly, the resin layer 220 may diffuse the light emitted from the first light emitting device 101 and guide the light emitted from the second light emitting device 102 in the lateral direction. The resin layer 220 may be formed to have a thickness Zb that is thicker than that of the first light emitting device 101. Accordingly, the resin layer 220 may protect the upper portion of the first light emitting device 101 and prevent moisture penetration. Since the first substrate 210 is disposed on the lower portion of the first light emitting device 101 and the resin layer 220 is disposed on the upper portion of the first light emitting device 101, the first light emitting device 101 may be protected. Accordingly, the interval between the upper surface of the resin layer 220 and the first light emitting device 101 may be 0.6 mm or less, for example, in the range of 0.5 mm to 0.6 mm. An upper portion of the resin layer 220 may be disposed to have the same thickness as the interval to protect an upper portion of the first light emitting device 101. The thickness Zb of the resin layer 220 is a distance from the upper surface of the first reflective member 230 to the lower surface of the second substrate 240, and a distance (e.g., Zb) between the first reflective member 230 and the second substrate 240 may be smaller than the distance between the first surface S1 and the second surface S2. For example, the distance between the first surface S1 and the second surface S2 may include a maximum distance or a minimum distance. The maximum distance may be a linear distance between the convex portion P1 and the second surface S2. By disposing the distance between the first reflective member 230 and the second substrate 240 to be smaller than the width Y1 or the minimum width in the second direction Y of the lighting module 200, a line-shaped surface light source may provide and it may improve brightness and prevent hot spots. In addition, it is possible to provide a lighting module that is flexible in the third direction Z. The thickness Zb of the resin layer 220 may be less than or equal to twice the thickness of the first light emitting device 101, for example, more than 1 to 2 times or less. The thickness Zb of the resin layer 220 may be, for example, in the range of 1.5 mm to 1.9 mm or in the range of 1.6 mm to 1.8 mm. The thickness Zb of the resin layer 220 may be 0.8 times or less of the thickness Z1 of the lighting module 200, for example, in a range of 0.4 times to 0.8 times the thickness Z1 of the lighting module 200. Since the resin layer 220 is disposed with a difference of 1.2 mm or less from the thickness Z1 of the lighting module 200, it is possible to prevent a decrease in light efficiency in the lighting module 200 and to strengthen the ductility characteristics.

The resin layer 220 may include a resin material such as silicone, silicone molding compound (SMC), epoxy, or epoxy molding compound (EMC). The resin layer 220 may include a UV (ultra violet) curable resin or a thermosetting resin material, for example, may selectively include PC, OPS, PMMA, PVC, and the like. A bead (not shown) may be included in the resin layer 220, and the bead may diffuse and reflect incident light, thereby increasing the amount of light. The resin layer 220 may include a phosphor. The phosphor may include at least one of a yellow phosphor, a green phosphor, a blue phosphor, and a red phosphor.

A region in the resin layer 220 in which the convex portion P1 is formed may serve as a lens portion. The lens unit of the resin layer 220 is a lens having a convex curved surface, and may include a hemispherical shape when viewed from a top view. In a region corresponding to the center of the first light emitting device 101, the distance from the lens portion to the first light emitting device 101 may be greater. The thickness of the lens portion in the third direction Z may be the thickness Zb of the resin layer 220. Since the lens portion has flat upper and lower surfaces and a curved surface in the first surface S1 direction, it is possible to diffuse light incident in the first surface S1 direction. The lens portion may be disposed between the first reflective member 230 and the second substrate 240 that are flat on the upper and lower portions to refract light to the first surface S1 to be emitted. The lens portion may refract light incident to a region deviating from the optical axis with respect to the optical axis at an exit angle greater than an incidence angle. The concave portion C1 disposed between the convex portions P1 in the resin layer 220 is provided as a recess concave in the direction of the second surface S2, and the recess may include a concave curved surface or a curved surface S11 having an inflection point. The recess of the resin layer 220 may be formed as a concave curved surface S11 on the surface of the resin layer 220 to refract incident light. The recess of the concave portion C1 refracts the light emitted from the second light emitting device 102 in the region between the convex portions P1, thereby suppressing the occurrence of the dark portion. Here, when the convex portion P1 and the concave portion C1 are disposed in the resin layer 220, the first substrate 210, the first reflective member 230, and the second substrate 240 may be formed in a shape corresponding to the convex portion P1 and the concave portion C1. The number of the convex portions P1 or the lens portions of the resin layer 220 may be the same as the number of the first light emitting devices 101.

The first reflective member 230 may reflect the light emitted from the first and second light emitting devices 101 and 102. The first reflective member 230 may be formed on the upper surface of the first substrate 210. The first reflective member 230 may be formed as an upper layer of the first substrate 210 or as a separate layer. The first reflective member 230 may be adhered to the upper surface of the first substrate 210 with an adhesive. The resin layer 220 may be adhered to the upper surface of the first reflective member 230. The first reflective member 230 has a plurality of openings 232 in a region corresponding to the lower surface of the first light emitting device 101, and the first light emitting device 101 may be connected to the first substrate 210 through the opening 232. A portion of the resin layer 220 may be in contact with the first substrate 210 through the opening 232. The opening 232 may be a region in which the first light emitting device 101 is bonded to the first substrate 210. The first reflective member 230 may be formed in a single-layer or multi-layer structure. The first reflective member 230 may include a material that reflects light, for example, a metal or a non-metal material. When the first reflective member 230 is a metal, it may include a metal layer such as stainless steel, aluminum (Al), or silver (Ag), and in the case of a non-metallic material, it may include a white resin material or a plastic material. The first reflective member 230 may include a white resin material or a polyester (PET) material. The first reflection member 230 may include at least one of a low reflection film, a high reflection film, a diffuse reflection film, and a regular reflection film. The first reflective member 230 may be provided as, for example, a regular reflective film for reflecting the incident light to the first surface S1.

A thickness Zc of the first reflective member 230 may be smaller than a thickness Za of the first substrate 210. The thickness Zc of the first reflective member 230 may be 0.5 times or more of the thickness Za of the first substrate 210 to reduce transmission loss of incident light. The thickness Zc of the first reflective member 230 may be in the range of 0.2 mm to 0.4 mm, and when it is smaller than the above range, light transmission loss may occur, and when it is thicker than the above range, the thickness Z1 of the lighting module 200 may increase.

Figure 3:
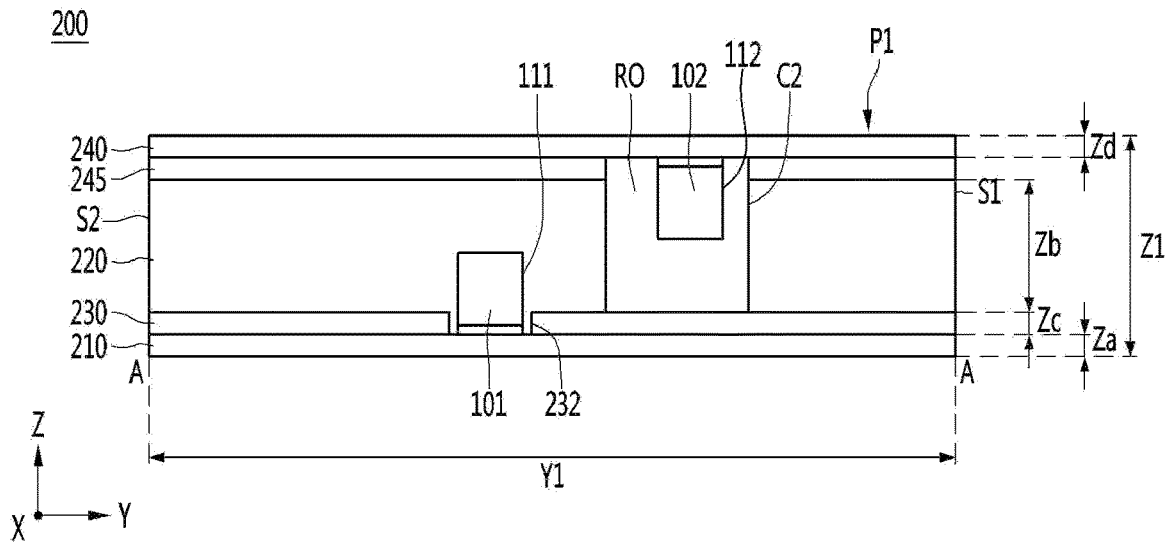
FIG. 3 is another example of a cross-sectional view taken along the A-A side of the lighting module of FIG. 1.

The second substrate 240 may be disposed on the resin layer 220. The second substrate 240 may be adhered to the upper surface of the resin layer 220. The second substrate 240 may be disposed on the entire upper surface of the resin layer 220 to reduce light loss. The thickness Zd of the second substrate 240 may be the same as or different from the thickness Za of the first substrate 210. The second substrate 240 may include the same material as the first reflective member 230 for light reflection, or another member may be further attached to the lower surface of the second substrate 240. As shown in FIG. 3, a second reflective member 245 may be disposed between the second substrate 240 and the resin layer 220. The second reflective member 245 may be adhered to the upper surface of the resin layer 220. The second reflective member 245 may be exposed to the hole R0 of the resin layer 220 or may extend within the hole R0. The second reflective member 245 may be disposed closer to the second light emitting device 102 than to the resin layer 220. In order to reflect light and reduce transmission loss of light, the second reflective member 245 may be made of a material having a higher light reflectance than that of the first reflective member 230 or may have a thicker thickness. The second reflective member 245 may have the same thickness or a thicker thickness as the first reflective member 230. For example, the first and second reflective members 230 and 245 may be provided with the same material and the same thickness. The second reflective member 245 may have a single-layer or multi-layer structure. The second reflective member 245 may include a material that reflects light, for example, a metal or a non-metal material. When the second reflective member 245 is a metal, it may include a metal layer such as stainless steel, aluminum (Al), or silver (Ag), and in the case of a non-metallic material, it may include a white resin material or a plastic material. The second reflective member 245 may include a white resin material or a polyester (PET) material. The second reflection member 245 may include at least one of a low reflection film, a high reflection film, a diffuse reflection film, and a regular reflection film. The second reflective member 245 may be provided as a regular reflective film so that, for example, incident light travels in the direction of the first surface S1.

As shown in FIG. 1, the hole R0 may include a concave reflective portion C2 and convex emission portions C21 and C22. The reflective portion C2 may face the concave portion C1. The reflective portion C2 may be depressed from the concave portion C1 toward the second light emitting device 102. The emission portions C21 and C22 may have convex curved surfaces on both sides of the reflective portion C2 and may protrude in the direction of the first surface S1. Accordingly, the reflective portion C2 corresponds to the center of the second light emitting device 102 and may reflect incident light, and the emission portions C21 and C22 may refract the light incident from the second light emitting device 102 and the light reflected by the reflective portion C2. The first and second emission portions C21 and C22 may extend from the outside of the second light emitting device 102 in the rear direction or the second surface S2 direction, and may be connected to each other. The rear regions of the first and second emission units C21 and C22 may have a smaller area than the front regions, thereby reducing light loss.

The region of the hole R0 may be in contact with a straight line Y2 passing through a point ½ of a directivity angle with respect to the central axis Y0 of the first light emitting device 101 or may be disposed outside of the straight line Y2. Accordingly, the region of the hole R0 may be disposed in a region that does not affect the distribution of light emitted from the first light emitting device 101. The directivity angle may range from 120 degrees to 140 degrees.

The stacked structure of the first substrate 210, the first reflective member 230, the resin layer 220, and the second substrate 240 may include the convex portion P1 and the concave portion C1. The convex portion P1 may have a flat upper surface and a flat lower surface, and may include a curved surface or a hemispherical shape in the first direction X. The concave portion C1 may include the concave curved surface in the direction of the second surface S2. The convex curved surface and the concave curved surface of the resin layer 220 may be treated as a haze surface, so that light may be diffused. The haze surface may be treated as a surface rougher than the inner surface of the resin layer 220 to diffuse the emitted light. The lighting module 200 according to an embodiment of the invention may provide the thickness Z1 in the third direction Z in the form of a line to provide a surface light source in the form of a line having ductility. The thickness Z1 of the lighting module 200 may be 3 mm or less. That is, the lighting module 200 may be provided as a line-shaped surface light source of 3 mm or less. As another example, the lighting module 200 may be disposed to be 6 mm or less. In this case, the thickness of the lighting module 200 is increased, but the thickness of the resin layer 220 is provided to increase the line width and light distribution area may be increased. As for the thickness of each component in the lighting module 200, when the thickness of the first substrate 210 is Za, the thickness of the resin layer 220 is Zb, the thickness of the first reflective member 230 is Zc, and the thickness of the second substrate 240 is Zd, it may have a relationship of Zb>Za=Zd≥Zc. A distance between the lower surface of the first substrate 210 and the upper surface of the second substrate 240 is the thickness Z1 of the lighting module 200. The thickness Zb may have a ratio of 0.4 to 0.8 of Z1, the thickness Za may have a ratio of 0.14 to 0.18 of Z1, and the thickness Zc may have a ratio of 0.08 to 0.12 of Z1. The Zb may have a ratio of 3.5 to 4 of Za. The Zb may have a ratio of 5.8 to 6.4 of Zc. By disposing the thickness Zb of the resin layer 220 thicker than the thickness Za of the first substrate 210, the first light emitting device 101 may be protected and light may be diffused to guide it, and the ductility characteristic may be strengthened. The maximum width W1 of the convex portion P1 in the first direction is a distance between the adjacent concave portions C1 and may be equal to or smaller than the pitch G1 of the first light emitting devices 101. When the maximum width W1 of the convex portion P1 is greater than the pitch G1 between the first light emitting devices 101, two or more first light emitting devices 101 may be disposed in the region of the convex portion P1 and the luminous intensity may be increased. When the maximum width W1 of the convex portion P1 is smaller than the pitch G1 between the first light emitting devices 101, although the size of the convex portion P1 is small, it is possible to provide a uniform distribution of light, but the luminous intensity may be reduced.

The maximum width W1 of the convex portion P1 may be 15 mm or more, for example, in a range of 15 mm to 20 mm. The maximum width W1 of the convex portion P1 may be greater than the depth D4 of the concave portion C1. A ratio of the maximum width W1 of the convex portion P1 to the depth D4 of the concave portion C1 may be in the range of 1:0.4 to 1:0.7. When the depth of the concave portion C1 is smaller than the above range, the dark region between the adjacent convex portions P1 may be increased. When the depth of the concave portion C1 is greater than the above range, the concave portion C1 may extend to a region adjacent to the first light emitting device 101, thereby increasing optical interference between the first light emitting devices 101. The depth D4 of the concave portion C1 may be a straight-line distance between the bottom point of the concave portion C1 from a straight line connecting the apexes of the convex portions P1. The curved surface of the convex portion P1 and the curved surface of the concave portion C1 may have different curvatures. The radius of curvature of the convex portion P1 may be in the range of 8 mm or more, for example, in the range of 8 mm to 14 mm or in the range of 9 mm to 11 mm. When the radius of curvature of the convex portion P1 is smaller than the above range, the improvement in luminous intensity is insignificant. A radius of curvature of the concave portion C1 may be ⅛ times smaller than a radius of curvature of the convex portion P1. A ratio of the radius of curvature of the concave portion C1 to the radius of curvature of the convex portion P1 may be in the range of 1:8 to 1:28. When the radius of curvature of the concave portion C1 is smaller than the above range, the amount of light emitted through the concave portion C1 is reduced to increase the dark portion. and optical interference between the first light emitting devices 101 may occur. Accordingly, the depth D4 and the radius of curvature of the concave portion C1 are determined by considering the position of the first light emitting device 101 and the directivity angle of the first light emitting device 101, and it may be a range of for improving light uniformity through the convex portion P1 and the concave portion C1 and suppressing a dark portion in the concave portion C1. The radius of curvature of the concave portion C1 may be in the range of 0.5 to 1 mm. Since the concave portion C1 has a predetermined curvature and is provided in a curved shape, incident light may be refracted and transmitted, thereby reducing the occurrence of dark portions in a region of the concave portion C1. A region between the apex of the convex portion P1 and the first light emitting device 101 is a region for diffusing and emitting light in a uniform light distribution, and may be defined as a light diffusion region or a light guiding region. The distance D2 between the apex of the convex portion P1 and the first light emitting device 101 may be 10 mm or more, for example, in the range of 10 mm to 20 mm. When the distance D2 between the apex of the convex portion P1 and the first light emitting device 101 is within the above range, a uniform distribution may be provided through light diffusion, and the convex portion P1 and the first light emitting device 101 may have a uniform distribution. When the distance D2 between the first light emitting device 101 and the convex portion P1 is smaller than the above range, a hot spot may be generated. The distance between the convex portion P1 and the first light emitting device 101 may be greater than the radius of curvature of the convex portion P1, and may be, for example, in the range of 1.3 times or more or 1.3 times to 2.0 times the radius of curvature of the convex portion P1. A distance D1 between the concave portion C1 and a straight line connecting the first light emitting device 101 may be smaller than a depth D4 of the concave portion C1. The distance D1 may be 3 mm or more, for example, in the range of 3 mm to 12 mm, and when it is smaller than the distance D1, the depth D4 of the concave portion C1 is deepened or the distance D2 between the first light emitting device 101 and the convex portion P1 may be reduced, and a dark portion may be generated in the concave portion C1 or a hot spot may be generated in the convex portion P1. The lighting module 200 refracts and diffuses the light emitted from the first light emitting device 101 by the convex portion P1 of the resin layer 220, and may guide an irradiate as a line light source by the first and second substrates 210 and 240. The light emitted from the second light emitting device 102 is refracted and diffused by the concave portion C1 and the convex portion P1 of the resin layer 220, and the emission portions C21 and C22 of the hole R0, and may guide and irradiate as the line light source by the first and second substrates 210 and 240. Accordingly, the luminous intensity of the light emitted to the first surface of the lighting module may be 110% or more, that is, 115% or more compared to the structure without the second light emitting device 102.

Figure 4:
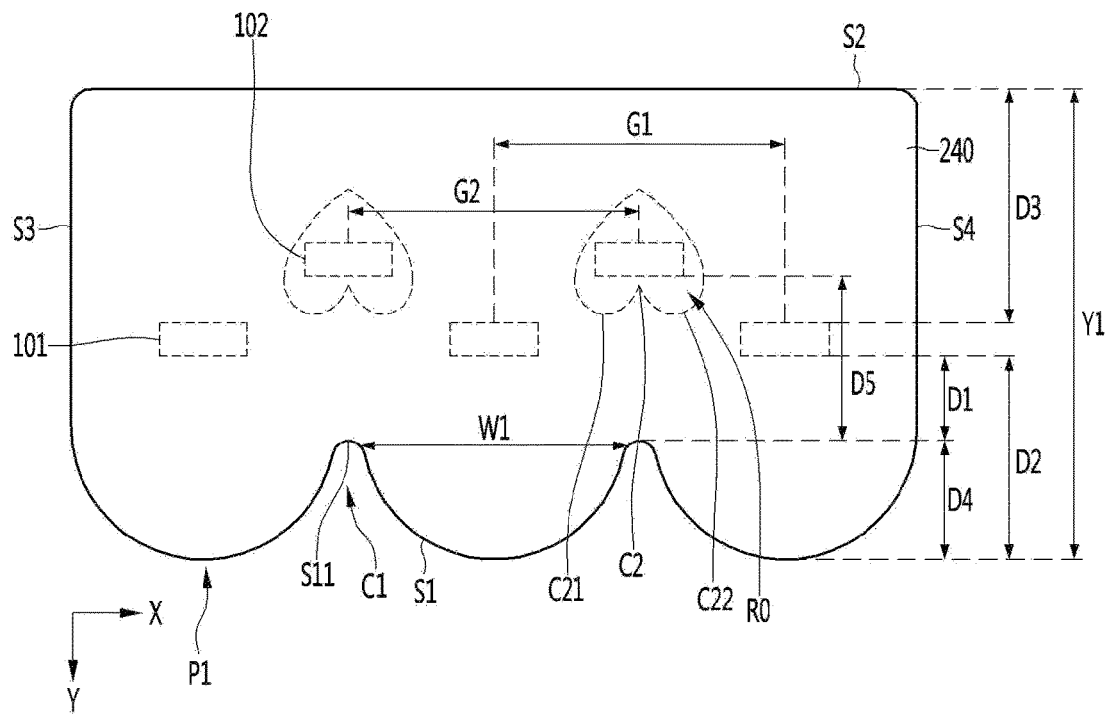
FIG. 4 is a first modified example of the lighting module of FIG. 1.

As shown in FIG. 4, the hole R0 may be disposed closer to the second surface S2 direction based on a virtual straight line connecting the plurality of first light emitting devices 101. A pitch G1 between the first light emitting devices 101 may be the same as a pitch G2 between the second light emitting devices 102. A distance D5 between the second light emitting device 102 and the concave portion C1 may be greater than a distance D1 between the concave portion C1 and the first light emitting device 101. In this structure, the position of the second light emitting device 102 may be changed according to the intensity of light emitted through the concave portion C1.

Figure 5:
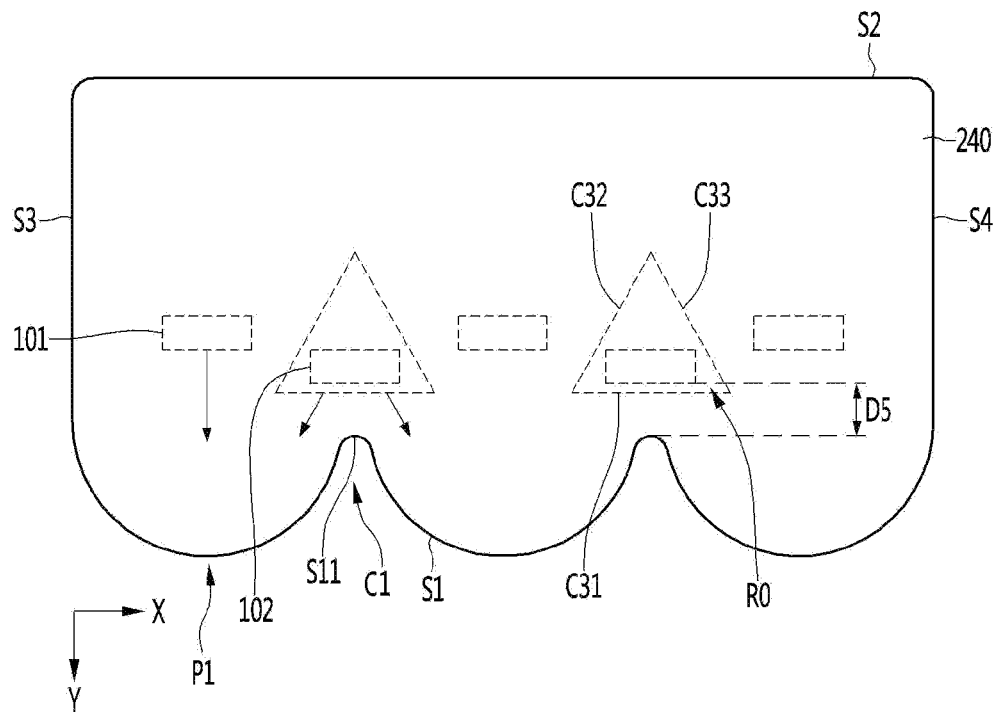
FIG. 5 is a second modified example of the lighting module of FIG. 1.

As shown in FIGS. 5 and 2 or 3, the hole R0 is disposed in the resin layer 220, and may include a first surface portion C31 facing the concave portion C1, and second and third surface portions C32 and C33 extending in the direction of the second surface S2 from both ends of the first surface portion C31. The second and third surface portions C32 and C33 may be disposed in a triangular shape with respect to the first surface portion C31. The first surface portion C31 may be disposed on a horizontal surface and may refract incident light. The hole R0 may be arranged in a polygonal shape, for example, a triangular shape, and a region close to the first surface S1 or the concave portion C1 may be a region between two apexes. The second light emitting device 102 disposed in the hole R0 may be disposed closer to the concave portion C1 or the first surface S1 than the first light emitting device 101. In this structure, the positions of the second light emitting device 102 and the hole R0 may be changed according to the intensity of light emitted through the concave portion C1.

Figure 6:
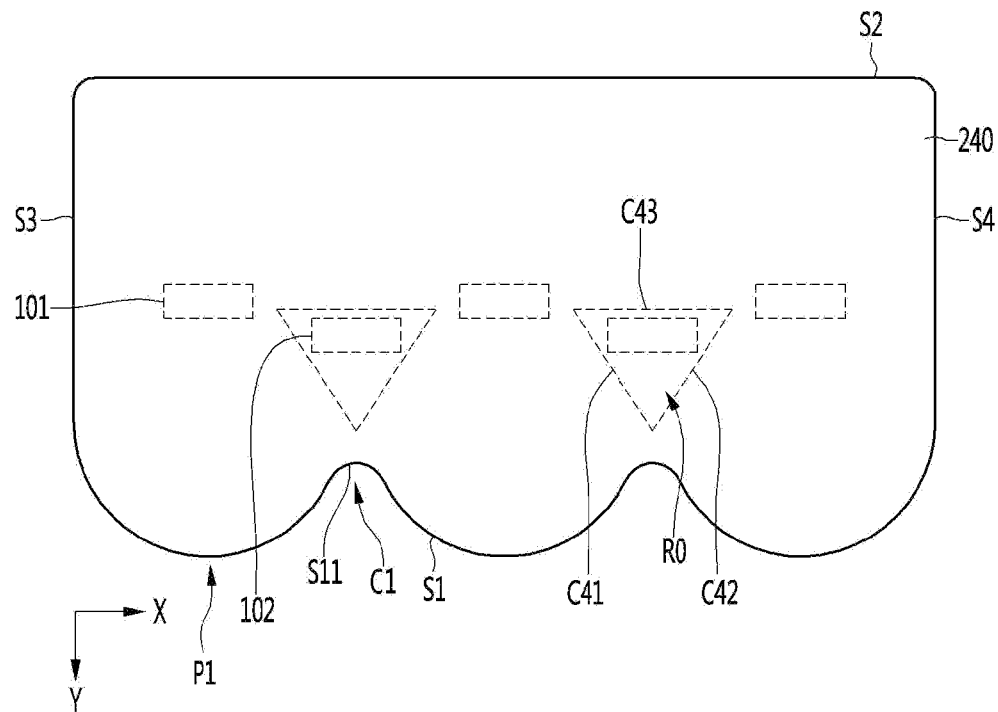
FIG. 6 is a third modified example of the lighting module of FIG. 1.

As shown in FIGS. 6 and 2 or 3, the hole R0 is disposed in the resin layer 220, and may include first and second surface portions C41 and C42 inclined based on an apex close to the concave portion C1 and a third surface portion C43 of the rear. The hole R0 may have an inverse shape of the triangular structure of FIG. 5. At this time, the apex portion, which is the connection point of the first and second surface portions C41 and C42, has a gradually narrower shape as it approaches the concave portion C1, so that the hot spot may be removed. In this structure, the positions of the second light emitting device 102 and the hole R0 may be changed according to the intensity of light emitted through the concave portion C1.

Figure 7:
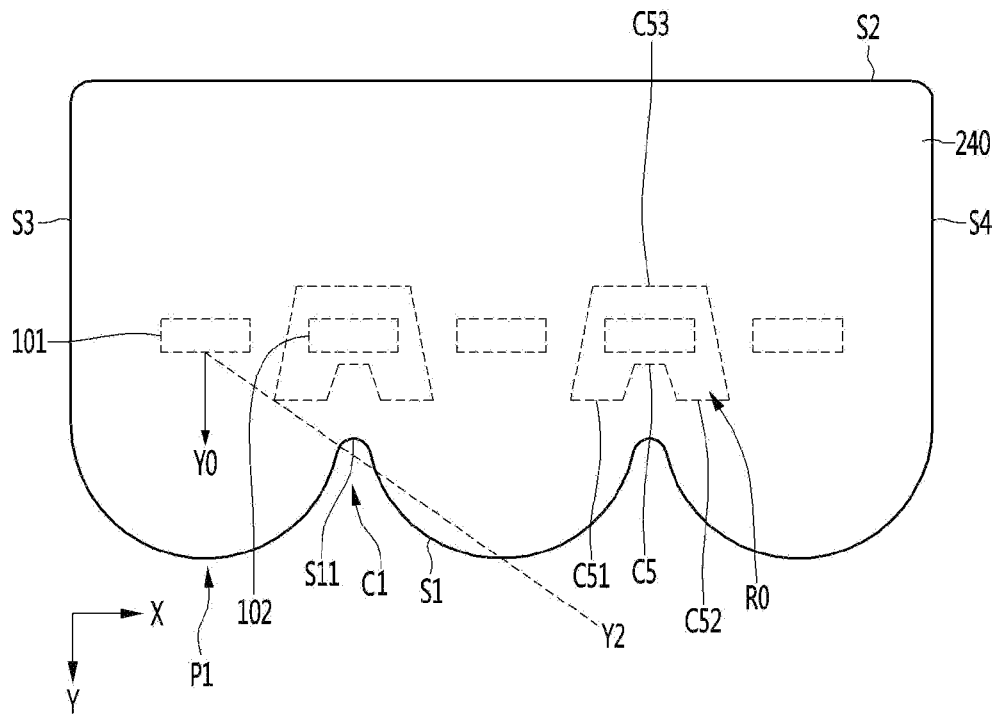
FIG. 7 is a fourth modified example of the lighting module of FIG. 1.
Figure 8:
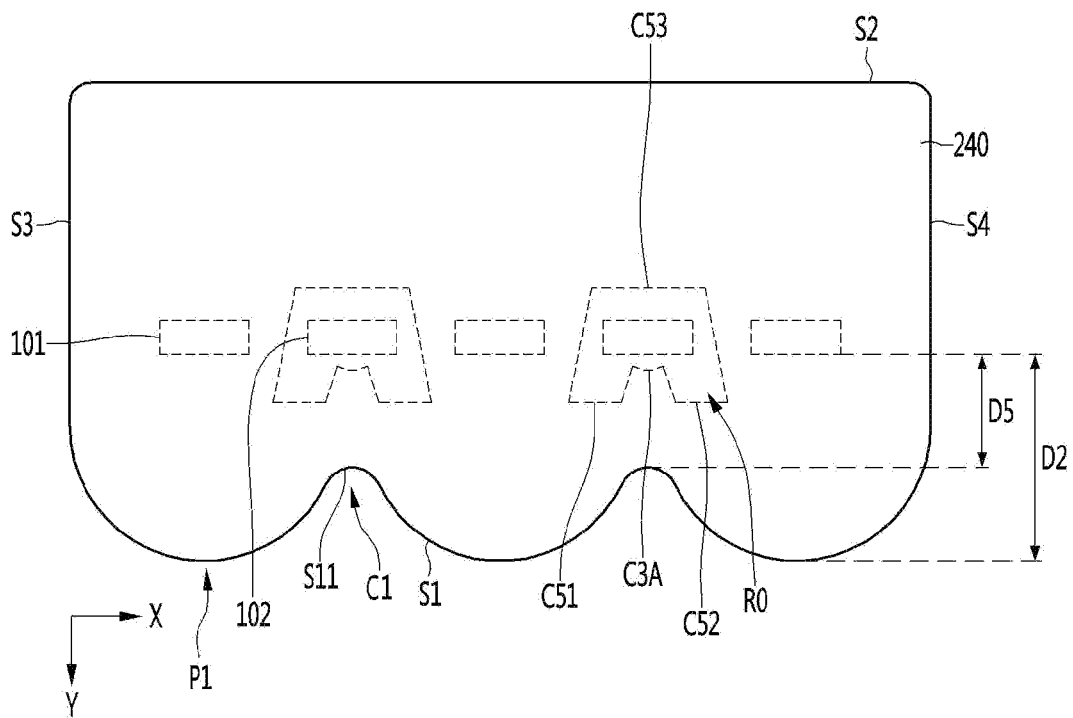
FIG. 8 is another example of the lighting module of FIG. 7.

As shown in FIGS. 7 and 2 or 3, the hole R0 has a second light emitting device 102 disposed therein, and may include a recess portion C5 corresponding to the concave portion C1, and emission portions C51 and C52 on the outside of the recess portion C5. The emission portions C51 and C52 have a protrusion structure capable of guiding light on both sides of the recess portion C5, so that the incident light may be refracted in the direction of the convex portion P1. The rear surface portion C53 extending from the emission portions C51 and C52 in the direction of the second surface S2 may have a flat or curved surface. When the first and second light emitting devices 101 and 102 are disposed on the same straight line, the emission portions C51 and C52 may be disposed outside the straight line Y2 pass through a point ½ of the direction angle of the light emitted from the first light emitting device 101. Accordingly, the emission portions C51 and C52 may be disposed closer to the first surface S1 than the position of the first light emitting device 101, and may not affect the light emitted from the first light emitting device 101. The straight line Y2 may pass through a boundary portion between the convex portion P1 and the concave portion C1 or may pass through an outermost point of the convex portion P1. In the structure of FIG. 7, the recess portion C5 disposed on the emission side of the second light emitting device 102 in the hole R0 has a flat structure, and in the structure of FIG. 8, the recess portion C3A may be is a curved surface convex toward the concave portion C1. The convex curved surface may refract light to emit it through the convex portion P1. In this case, since the curvature of the curved surface S11 of the concave portion C1 corresponding to the convex curved surface may be provided wider, the manufacturing process may be more convenient. Therefore, as described above, the emission side surface of the second light emitting device 102 in the hole R0 may suppress the hot spot caused by the second light emitting device 102 and improve the overall luminous intensity of the lighting module. In addition, by distributing the light emitting devices 101 and 102 on different substrates, the luminous intensity may be improved and the heat dissipation problem caused by the light emitting devices 101 and 102 may be reduced.

Figure 9:
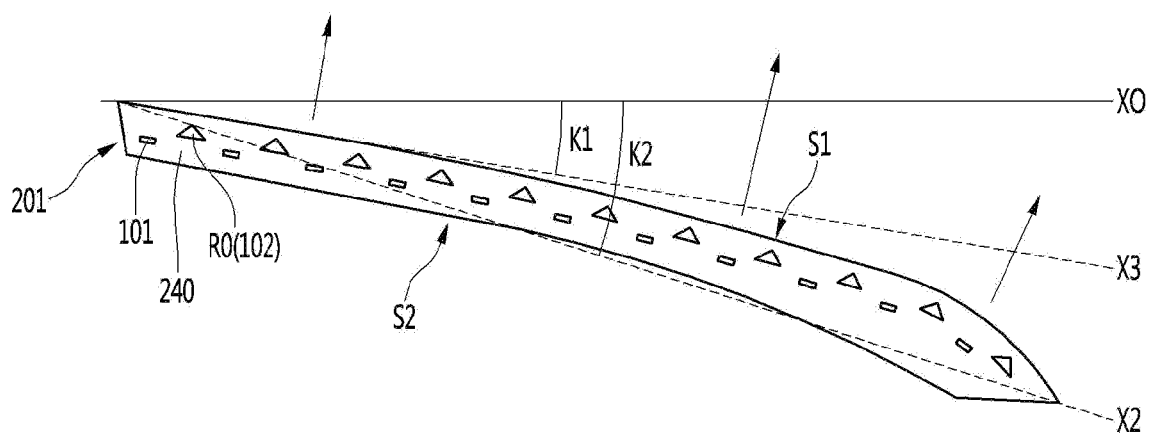
FIG. 9 is another example of a lighting module according to an embodiment of the invention.

As shown in FIG. 9, the lighting module 201 may be provided in a curved shape based on a horizontal straight line X0. When applied to a vehicle ramp, it may be combined into a curved ramp shape extending to the rear (or front) and sides of the vehicle. In the lighting module 201, the angle from the virtual straight line X2 connecting both ends of the first surface S1 to the straight line X0 may be an angle K2 in the range of 10 degrees to 60 degrees, A virtual straight line X3 extending in a tangential direction from the first surface S1 disposed at one end of the lighting module 201 may have an angle K1 in the range of 5 degrees to 30 degrees. A virtual line connecting the adjacent light emitting devices 101 in the lighting module 201 may include a straight line, an oblique line, or a curved line. The virtual line connecting the plurality of holes R0 may include a straight line, an oblique line, or a curved line. Here, a portion of the line connecting the light emitting devices 101 may be disposed closer to the first surface direction than the virtual straight line connecting the other end from one end of the first surface S1 of the lighting module 201. In FIG. 9, the convex portion and the concave portion may include as in FIG. 1, and for detailed configuration, refer to the description of FIGS. 1 and 2.

Figure 10:
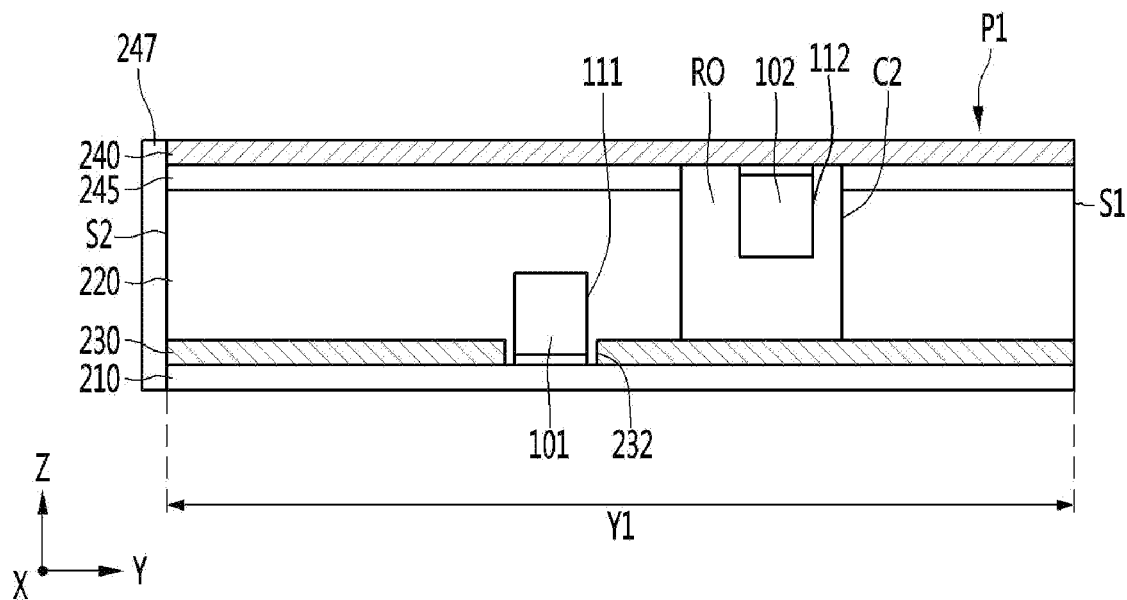
FIG. 10 is an example in which a reflective member is disposed at the rear of the lighting module according to an embodiment of the invention.

Meanwhile, the first reflective member 230 may be spaced apart from the edge of the first substrate 210, and a portion of the resin layer 220 may be in contact with an upper surface of an edge side of the first substrate 210. When the resin layer 220 is in contact with the edge of the first substrate 210, moisture penetration may be suppressed. As another example, in the lighting module shown in FIGS. 2 and 10, a third reflective member 247 may be further disposed on the surfaces S2, S3, and S4 of surfaces of the resin layer 220 except for the first surface S1. The third reflective member 247 may prevent light leakage and increase the amount of light extracted to the first surface S1. The third reflective member 247 may be made of the above-described first or second reflective member 230 or 240. The third reflective member 247 may be in contact with or spaced apart from the side surface of the resin layer 220.

Figure 11A:
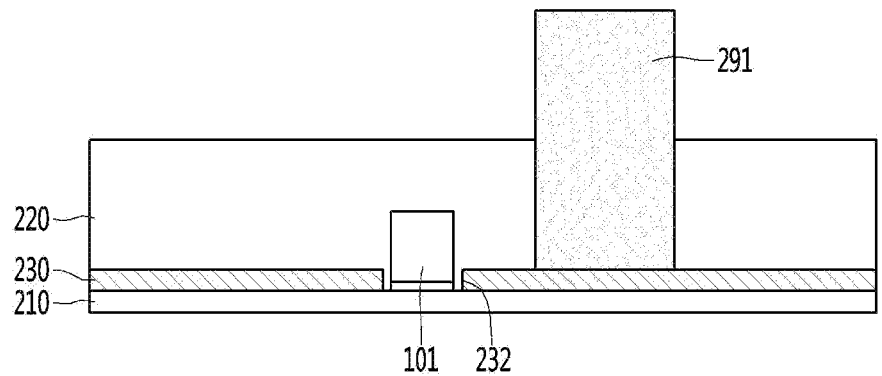
FIGS. 11A to 11C are views for explaining a manufacturing process of a lighting module according to an embodiment of the invention.
Figure 11B:
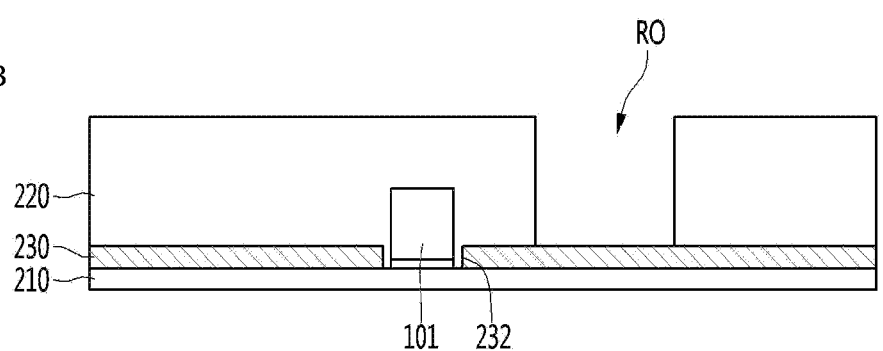
Figure 11C:
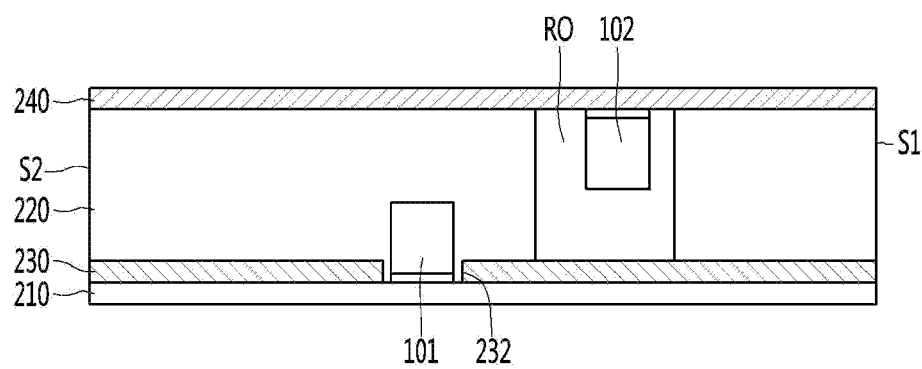

FIG. 11(A)-(C) are views illustrating a manufacturing process of a lighting module according to an embodiment. As shown in FIG. 11A, the fixing pin 291 may pass through the resin layer 220 and contact the first reflective member 230 or the first substrate 210. In this case, the fixing pin 291 may be disposed before the resin layer 220 is formed, and after the resin layer 220 is dispensed and cured, it may be separated as shown in FIG. 11(B). As another example, after dispensing the resin layer 220, the fixing pins 291 are positioned, and when the resin layer 220 is cured, the fixing pins may be separated as shown in FIG. 11(B). As shown in FIG. 11C, when the hole R0 is formed in the region from which the fixing pin is removed, the second substrate 240 on which the second light emitting device 102 is mounted is disposed on the resin layer 220. The second light emitting device 102 may be inserted into the hole R0. The second substrate 240 may be disposed on the resin layer 220 and the hole R0. At least one position of the hole R0 may be disposed in a region between the first light emitting devices 101.

Figure 12:
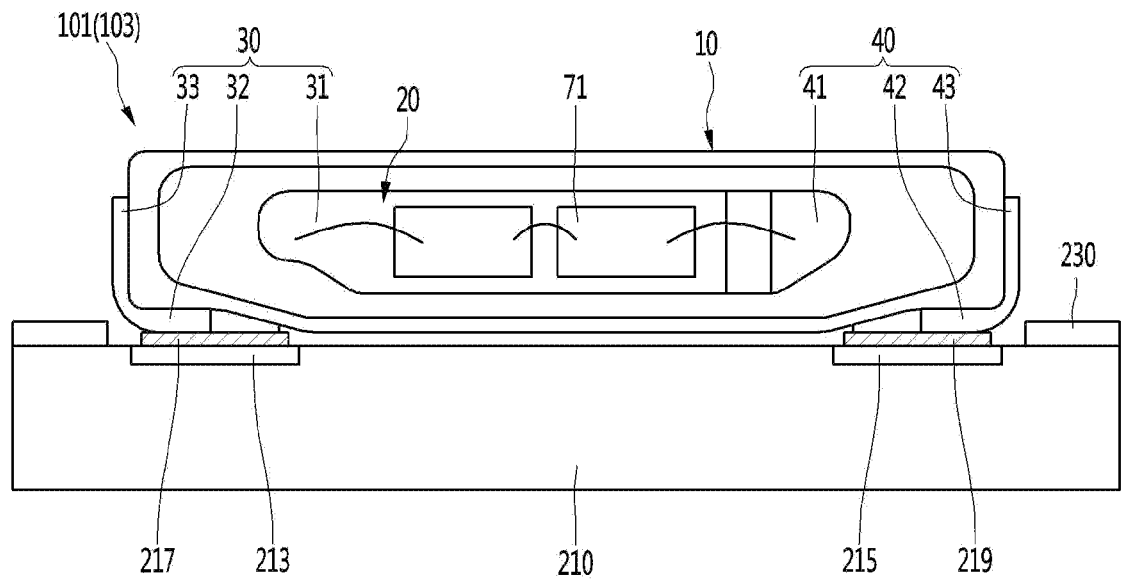
FIG. 12 is an example of a front view of a light emitting device applied to a lighting module according to an embodiment of the invention.
Figure 13:
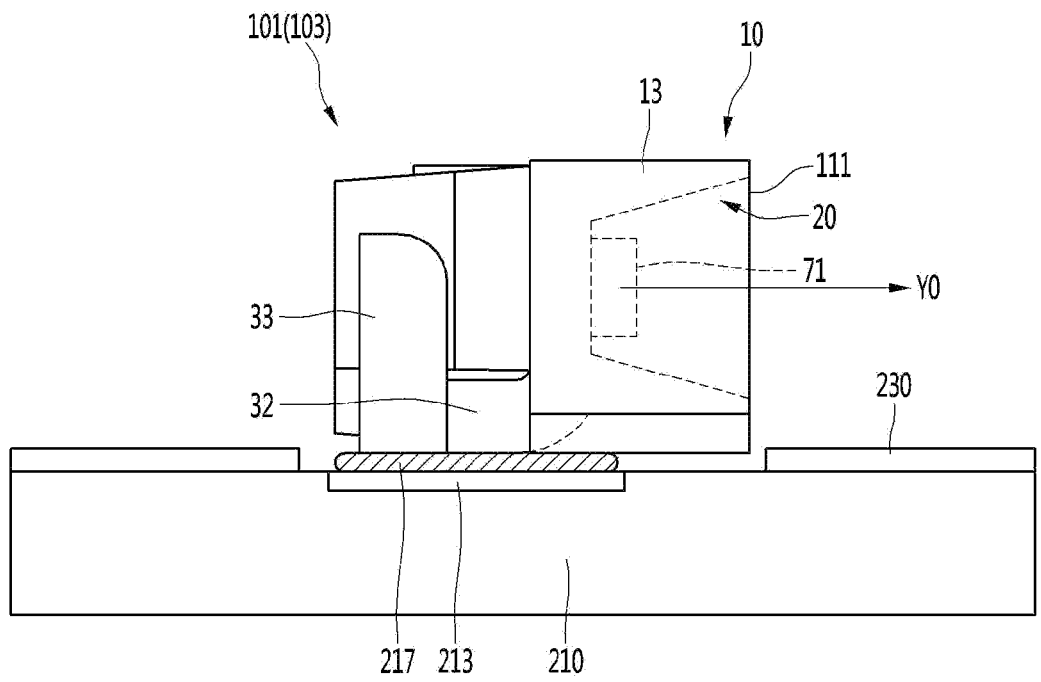
FIG. 13 is an example of a module in which the light emitting device of FIG. 12 is disposed on a circuit board.
Figure 13:
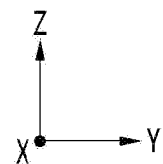

FIG. 12 is an example of a module in which a light emitting device is disposed on a circuit board in a lighting module according to an embodiment of the invention, and FIG. 13 is a view of the module viewed from the other side of FIG. 12.

Referring to FIGS. 12 and 13, the light emitting devices 101 and 102 include a body 10 having a cavity 20, a plurality of lead frames 30 and 40 in the cavity 20, and one or a plurality of light emitting chips 71 disposed on at least one of the plurality of lead frames 30 and 40. These light emitting devices 101 and 102 are an example of the light emitting device disclosed in the above embodiment, and may be implemented as a side emission type package. The light emitting devices 101 and 102 may have a length (or a length of a long side) in the second direction X that is three times or more, for example, four times or more than a width in the second direction Y. The length in the first direction may be 2.5 mm or more, for example, a range of 2.7 mm to 6 mm or a range of 2.5 mm to 3.2 mm. The number of the light emitting devices 101 and 102 may be reduced in the first direction X by providing a longer length in the first direction X. The light emitting devices 101 and 102 may provide a relatively thin thickness, thereby reducing the thickness of a lighting device having the light emitting devices 101 and 102. The thickness of the light emitting devices 101 and 102 may be in the range of 2 mm or less, for example, 1.5 mm or less, or 0.6 mm to 1 mm. Since the body 10 has the cavity 20 and has the length in the first direction X that is three times or more compared to the thickness of the body 10, the direction angle of the light in the first direction X may be widen. At least one or a plurality of lead frames 30 and 40 are disposed on the body 10. At least one or a plurality of lead frames 30 and 40 are disposed on the bottom of the cavity 20. A first lead frame 30 and a second lead frame 40 are coupled to the body 10, for example. The body 10 may be formed of an insulating material. The body 10 may be formed of a reflective material. The body 10 may be formed of a material having a reflectance higher than a transmittance for a wavelength emitted from the light emitting chip, for example, a material having a reflectance of 70% or more. When the reflectance is 70% or more, the body 10 may be defined as a non-transmissive material or a reflective material. The body 10 may be formed of a resin-based insulating material, for example, a resin material such as Polyphthalamide (PPA). The body 10 may be formed of a silicone-based, epoxy-based, or thermosetting resin including a plastic material, or a material having high heat resistance and high light resistance. The body 10 includes a white-based resin. In the body 10, an acid anhydride, an antioxidant, a mold release material, a light reflector, an inorganic filler, a curing catalyst, a light stabilizer, a lubricant, and titanium dioxide may be selectively added therein. The body 10 may include a reflective material, for example, a resin material to which a metal oxide is added, and the metal oxide may include at least one of $TiO_2$, $SiO_2$, and $Al_2O_3$. The body 10 may effectively reflect incident light. As another example, the body 10 may be formed of a translucent resin material or a resin material having a phosphor for converting the wavelength of incident light. The first side portion 15 of the body 10 may be a surface on which the cavity 20 is disposed, or a surface on which light is emitted. The second side portion of the body 10 may be the opposite side of the first side portion 15 or the second side.

The first lead frame 30 includes a first lead portion 31 disposed on the bottom of the cavity 20, a first bonding portion 32 disposed in a first outer region of the third side portion 11 of the body 10, and a first heat dissipation portion 33 disposed on the third side portion 13 of the body 10. The first bonding portion 32 is bent from the first lead portion 31 in the body 10 and protrudes to the third side portion 11, and the first heat dissipation portion 33 may be bent from the first bonding portion 32. The first outer region of the third side portion 13 may be a region adjacent to the third side portion 13 of the body 10. The second lead frame 40 includes a second lead portion 41 disposed on the bottom of the cavity 20, a second bonding portion 42 disposed in a second outer region of the third side portion 11 of the body 10, and a second heat dissipation portion 43 disposed on the fourth side portion 14 of the body 10. The second bonding portion 42 may be bent from the second lead portion 41 in the body 10, and the second heat dissipation portion 43 may be bent from the second bonding portion 42. The second outer region of the third side portion 11 may be a region adjacent to the fourth side portion 14 of the body 10. The gap portion 17 between the first and second lead portions 31 and 41 may be formed of a material of the body 10, and may be on the same horizontal plane as the bottom of the cavity 20 or may protrude, but not limited thereto. As another example, two or more lead frames may be disposed in the body 10, for example, three lead frames are disposed, one of which may be a heat dissipation frame or a frame of positive polarity, and the other two may be of other negative polarity.

Here, the light emitting chip 71 may be disposed on the first lead portion 31 of the first lead frame 30, for example, and may be connected to the first and second lead portions 31 and 32 by the wires 72 and 73, or may be connected to the first lead portion 31 with an adhesive and connected to the second lead portion 41 with a wire. The light emitting chip 71 may be a horizontal chip, a vertical chip, or a chip having a via structure. The light emitting chip 71 may be mounted in a flip chip method. The light emitting chip 71 may selectively emit light within a wavelength range of ultraviolet to visible light. The light emitting chip 71 may emit, for example, ultraviolet or blue peak wavelength. The light emitting chip 71 may include at least one of a group II-VI compound and a group III-V compound. The light emitting chip 71 may be formed of, for example, a compound selected from the group consisting of GaN, AlGaN, InGaN, AlInGaN, GaP, AN, GaAs, AlGaAs, InP, and mixtures thereof. A plurality of light emitting chips 71 may be connected in series or a plurality of light emitting chips 71 may be connected in parallel. One or a plurality of light emitting chips 71 disposed in the cavity 20 of the light emitting devices 101 and 102 according to the embodiment may be disposed. The light emitting chip 71 may be selected from, for example, a red LED chip, a blue LED chip, a green LED chip, and a yellow green LED chip.

Looking at the inner side of the cavity 20, the inner surface disposed around the cavity 20 may be inclined with respect to a horizontal straight line of the upper surfaces of the lead frames 30 and 40. The inner side of the cavity 20 may have a vertically stepped area from the first side portion 15 of the body 10. The stepped region may be disposed to be stepped between the first side portion 15 and the inner surface of the body 10. The stepped region may control a directivity characteristic of light emitted through the cavity 20. A molding member 81 is disposed in the cavity 20 of the body 11, and the molding member 81 includes a light-transmitting resin such as silicone or epoxy, and may be formed in a single layer or in multiple layers. The molding member 81 or the light emitting chip 71 may include a phosphor and the phosphor excites a portion of the light emitted form the light emitting chip 71 to emit light of a different wavelength. The phosphor may be selectively formed from quantum dots, YAG, TAG, silicate, nitride, and oxy-nitride-based materials. The phosphor may include at least one of a red phosphor, a yellow phosphor, and a green phosphor, but is not limited thereto. The surface of the molding member 81 may be formed in a flat shape, a concave shape, a convex shape, or the like, but is not limited thereto. As another example, a light-transmitting film having a phosphor may be disposed on the cavity 20, but the present disclosure is not limited thereto. A lens may be further formed on the upper portion of the body 10, and the lens may include a structure of a concave and/or convex lens, and adjust the light distribution of light emitted from the light emitting devices 101 and 102. A semiconductor device such as a light receiving device or a protection device may be mounted on the body 10 or any one of the lead frames, and the protection device may be implemented as a thyristor, a Zener diode, or a TVS (Transient voltage suppression), and the Zener diode protects the light emitting chip from electrostatic discharge (ESD).

Referring to FIG. 13, at least one or a plurality of light emitting devices 101 and 102 are disposed on a first substrate 210, and a protective layer and/or a second reflective member 230 is disposed around the lower portion of the light emitting devices 101 and 102. The light emitting devices 101 and 102 are examples of the light emitting devices disclosed in the embodiment, and emit light in the central axis Y0 direction, and may be applied to the lighting device disclosed above. The first and second lead portions 33 and 43 of the light emitting devices 101 and 102 are bonded to the electrode patterns 213 and 215 of the first substrate 210 with solder or conductive tape as conductive adhesive members 217 and 219.

Figure 14:
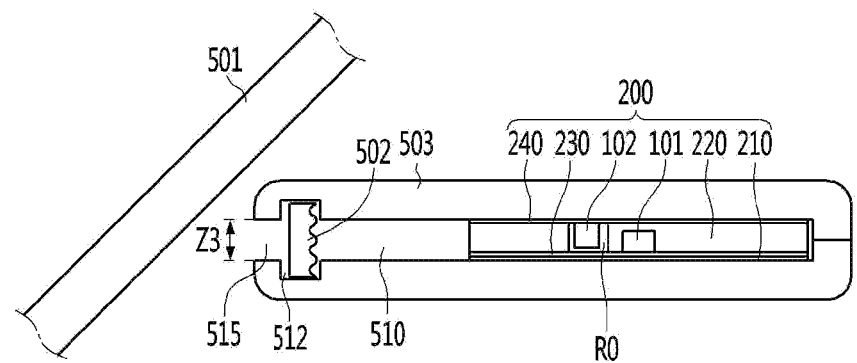
FIG. 14 is an example of a lamp to which a lighting module according to an embodiment of the invention is applied.

The lighting module according to an embodiment of the invention may be applied to a lamp as shown in FIG. 14. The lamp is an example of a vehicle lamp, and applicable to a head lamp, a side lamp, a side mirror lamp, a fog lamp, a tail lamp, a brake lamp, a daytime running lamp, a vehicle interior lighting, a door scar, a rear combination lamp, or a backup lamp. Referring to FIG. 14, the lighting module 200 disclosed above may be coupled to a lamp in a housing 503 having an inner lens 502. The thickness of the lighting module 200 is such that it may be inserted into the inner width of the housing 503. The width Z3 of the emitting portion 515 of the inner lens 502 may be equal to or less than twice the thickness of the lighting module 200, thereby preventing a decrease in luminous intensity. The inner lens 502 may be spaced apart from the first surface of the lighting module 200 by a predetermined distance, for example, 10 mm or more. An outer lens 501 may be disposed on the emission side of the inner lens 502. A lamp having such lighting module 200 is an example, and may be applied to other lamps as a structure having a ductility, for example, a curved surface or a curved structure when viewed from the side.

Figure 15:
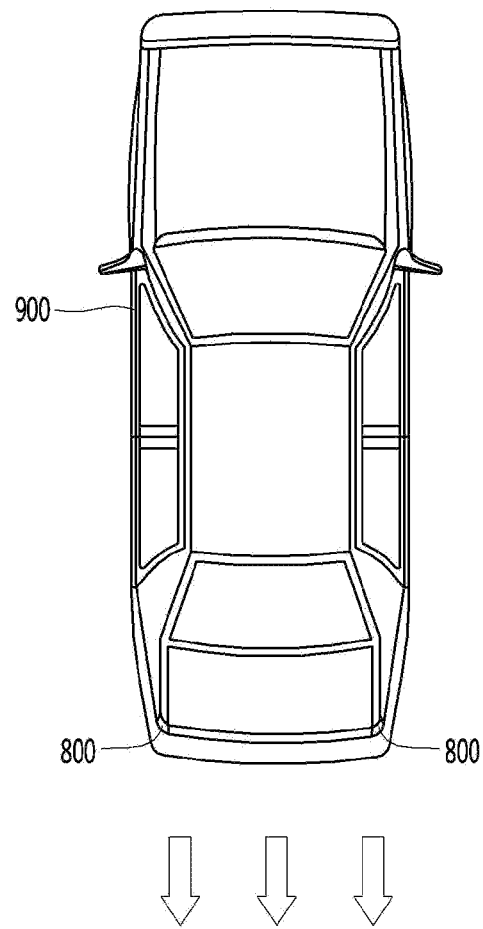
FIG. 15 is a plan view of a vehicle to which a lamp having a lighting device or a lighting module according to an embodiment of the invention is applied.
Figure 16:
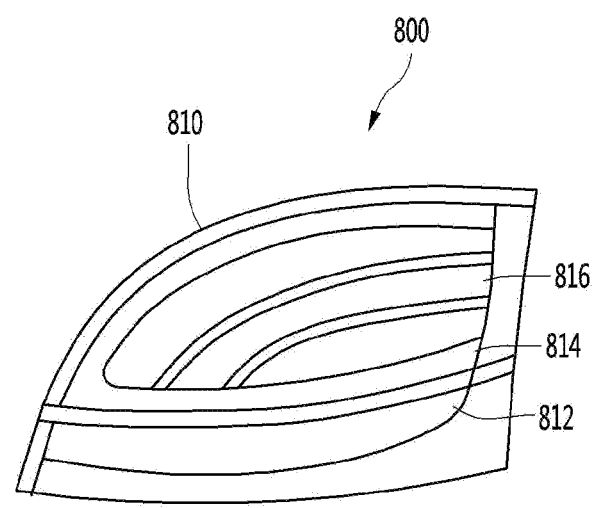
FIG. 16 is a view illustrating a lamp having the lighting module or lighting device of FIG. 15.

FIG. 15 is a plan view of a vehicle to which a vehicle lamp to which a lighting module is applied according to an embodiment is applied, and FIG. 16 is a view showing a vehicle lamp having a lighting module or a lighting device disclosed in the embodiment. Referring to FIGS. 15 and 16, the tail light 800 in the vehicle 900 includes a first lamp unit 812, a second lamp unit 814, a third lamp unit 816, and a housing 810. Here, the first lamp unit 812 may be a light source for the role of a turn indicator, the second lamp unit 814 may be a light source for the role of a sidelight, and the third lamp unit 816 may be a light source for role of a brake light, but is not limited thereto. At least one or all of the first to third lamp units 812, 814, and 816 may include the lighting device or module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

The invention claimed is:
1. A lighting device comprising:
a first substrate;
a plurality of first light emitting devices disposed on an upper surface of the first substrate;
a resin layer disposed on the upper surface of the first substrate and including a plurality of holes;
a second substrate disposed on an upper surface of the resin layer; and
a plurality of second light emitting devices disposed on a lower surface of the second substrate and respectively disposed in the plurality of holes,
wherein the plurality of first light emitting devices is arranged in a first direction between the upper surface of the first substrate and the upper surface of the resin layer, wherein the plurality of second light emitting devices is arranged in the first direction between the upper surface of the first substrate and the lower surface of the second substrate, wherein the resin layer includes a first surface from which light emitted from the first and second light emitting devices is emitted, wherein the resin layer includes a second surface opposite the first surface, wherein the first and second surfaces are spaced apart in a second direction orthogonal to the first direction, wherein the resin layer and the plurality of holes are disposed between the first substrate and the second substrate in a vertical direction orthogonal to the first and second directions, wherein the first surface of the resin layer includes a plurality of convex portions and a plurality of concave portions, wherein each of the plurality of first light emitting devices faces each of the plurality of convex portions in the second direction, wherein each of the plurality of second light emitting devices faces each of the plurality of concave portions in the second direction, wherein the plurality of first light emitting devices is disposed in a region between the first surface and the second surface of the resin layer, wherein the plurality of holes is arranged in the second direction in the region between the first surface and the second surface of the resin layer, and wherein each of the plurality of holes is disposed in a region between adjacent first light emitting devices and penetrates from the upper surface of the resin layer toward the first substrate.

2. The lighting device of claim 1, wherein the holes include a recess portion or a concave reflective portion having a convex curved surface facing to the concave portion.

3. The lighting device of claim 1, comprising a first reflective member on the resin layer and the first substrate, and a side surface of the resin layer and side surfaces of the first substrate and the second substrate are disposed on a same plane.

4. The lighting device of claim 3, further comprising a second reflective member between the resin layer and the second substrate.

5. The lighting device of claim 3, further comprising a third reflective member disposed on the surface opposite to the first surface of the resin layer.

6. The lighting device of claim 1, wherein the plurality of first light emitting devices and the plurality of second light emitting devices are arranged in different rows.

7. The lighting device of claim 1, wherein the plurality of first light emitting devices and the plurality of second light emitting devices do not overlap in the vertical direction, and wherein the plurality of first light emitting devices and the plurality of holes do not overlap in the vertical direction.

8. A lighting device comprising:
a first substrate;
a plurality of first light emitting devices disposed on an upper surface of the first substrate;
a first reflective member disposed on the upper surface of the first substrate;
a resin layer disposed on an upper surface of the first reflective member;
a second substrate disposed on an upper surface of the resin layer; and
a plurality of second light emitting devices disposed on a lower surface of the second substrate;

wherein the plurality of first light emitting devices is arranged in a first direction between the upper surface of the first substrate and the upper surface of the resin layer, wherein the plurality of second light emitting devices is arranged in the first direction between the upper surface of the first substrate and the lower surface of the second substrate, wherein the resin layer includes a plurality of holes in which the second light emitting devices are respectively disposed, wherein the resin layer and the plurality of holes are disposed between the first reflective member and the second substrate in a vertical direction, wherein a first surface of the resin layer faces emission surfaces of the first and second light emitting devices, and includes a plurality of convex portions and a plurality of concave portions, wherein the resin layer includes a second surface opposite the first surface, wherein the first and second surfaces are spaced apart in a second direction orthogonal to the first direction, wherein each of the convex portions faces each of the plurality of first light emitting devices in the second direction, wherein each of the concave portions faces each of the plurality of holes or the plurality of second light emitting devices in the second direction, wherein the plurality of holes is arranged in the second direction in a region between the first surface and the second surface of the resin layer, wherein each of the plurality of holes is disposed in a region between adjacent first light emitting devices and penetrates from the upper surface of the resin layer toward the first substrate, and wherein the plurality of first light emitting devices and the plurality of second light emitting devices do not overlap in the vertical direction orthogonal to the first and second directions.

9. The lighting device of claim 8, wherein each of the first and second light emitting devices has at least one LED chip and a body formed of a reflective material having the emission surface on one side and disposed around the LED chip.

10. The lighting device of claim 8, wherein each of the plurality of convex portions has a convex curved surface along a longitudinal direction of the first surface, wherein the convex portions and the concave portions are alternately arranged in a longitudinal direction of the first surface.

11. The lighting device of claim 8, wherein at least one of the plurality of second light emitting devices is disposed on a same line as a virtual straight line connecting the plurality of first light emitting devices.

12. The lighting device of claim 8, wherein at least one of the plurality of second light emitting devices is disposed closer to the first surface than the plurality of first light emitting devices, wherein the plurality of first light emitting devices and the plurality of second light emitting devices do not overlap in a vertical direction orthogonal to the first and second directions.

13. The lighting device of claim 8, wherein each of the plurality of second light emitting devices is not in contact with the resin layer.

14. A lighting device comprising:
a first substrate;
a plurality of first light emitting devices disposed on an upper surface of the first substrate;
a resin layer disposed on the upper surface of the first substrate;
a second substrate disposed on an upper surface of the resin layer; and
a plurality of second light emitting devices disposed on a lower surface of the second substrate,
wherein the plurality of first light emitting devices is arranged in a first direction between the upper surface of the first substrate and the upper surface of the resin layer,
wherein the plurality of second light emitting devices is arranged in the first direction between the upper surface of the first substrate and the lower surface of the second substrate,
wherein the resin layer includes first surface and a second surface opposite the first surface,
wherein the first and second surfaces are spaced apart in a second direction orthogonal to the first direction,
wherein the resin layer includes a plurality of holes into which each of the plurality of second light emitting devices is inserted,
wherein the resin layer and the plurality of holes are disposed between the first substrate and the second substrate in a vertical direction,
wherein the plurality of holes is arranged in the second direction in a region between the first surface and the second surface of the resin layer,
wherein the plurality of first light emitting devices and the plurality of second light emitting devices are arranged in different rows,
wherein the plurality of first light emitting devices and the plurality of second light emitting devices do not overlap in the vertical direction orthogonal to the first and second directions,
wherein the upper surface of the resin layer is located higher than upper ends of the plurality of first light emitting devices,
wherein a lower surface of the resin layer is located lower than lower ends of the plurality of second light emitting devices,
wherein the plurality of first light emitting devices emit light in one direction,
wherein the plurality of second light emitting devices emit light in one direction, and
wherein the first surface of the resin layer is disposed further outside the plurality of first light emitting devices and the plurality of second light emitting devices, and has a light extraction structure.

15. The lighting device of claim 8, wherein the plurality of first light emitting devices and the plurality of holes do not overlap in the first and second directions.

16. The lighting device of claim 14, wherein each of the first and second light emitting devices has an emission surface facing the first surface of the resin layer, and
wherein each of the plurality of holes is disposed in a region between adjacent first light emitting devices and penetrates from the upper surface of the resin layer toward the first substrate.

17. The lighting device of claim 14, wherein the plurality of second light emitting devices is non-contact with the resin layer.

18. The lighting device of claim 17,
wherein an outer surface of the plurality of holes is spaced apart from side surfaces of each of the plurality of second light emitting devices.

19. The lighting device of claim 16, wherein the light extraction structure includes a plurality of convex portions facing each of the first light emitting devices.

20. The lighting device of claim 19, comprising a plurality of concave portions facing each of the plurality of second light emitting devices between the plurality of convex portions,
wherein each of the plurality of convex portions has a convex curved surface, and
wherein each of the plurality of concave portions has a concave curved surface.

* * * * *